United States Patent
Omori et al.

(10) Patent No.: US 7,456,031 B2
(45) Date of Patent: Nov. 25, 2008

(54) EXPOSURE DEVICE, EXPOSURE METHOD, AND SEMICONDUCTOR DEVICE MANUFACTURING METHOD

(75) Inventors: Shinji Omori, Kanagawa (JP); Shigeru Moriya, Kanagawa (JP); Shinichiro Nohdo, Kanagawa (JP)

(73) Assignee: Sony Corporation, Tokyo (JP)

( * ) Notice: Subject to any disclaimer, the term of this patent is extended or adjusted under 35 U.S.C. 154(b) by 430 days.

(21) Appl. No.: 10/534,917

(22) PCT Filed: Nov. 13, 2003

(86) PCT No.: PCT/JP03/14460

§ 371 (c)(1),
(2), (4) Date: Sep. 26, 2005

(87) PCT Pub. No.: WO2004/044968

PCT Pub. Date: May 27, 2004

(65) Prior Publication Data

US 2006/0151710 A1    Jul. 13, 2006

(30) Foreign Application Priority Data

Nov. 14, 2002    (JP) ............................. 2002-331090

(51) Int. Cl.
  H01L 31/26    (2006.01)
  H01L 21/66    (2006.01)
(52) U.S. Cl. .............................. 438/14; 438/16; 438/17; 430/22; 430/30
(58) Field of Classification Search .................. 438/14, 438/16, 17, 18; 430/22, 30
See application file for complete search history.

(56) References Cited

U.S. PATENT DOCUMENTS 5,831,272 A    11/1998    Utsumi
5,989,759 A  *  11/1999    Ando et al. .................. 430/22

FOREIGN PATENT DOCUMENTS

| JP | 06-18220 | 1/1994 |
|---|---|---|
| JP | 08-203817 | 8/1996 |
| JP | 11-135423 | 5/1999 |
| JP | 411265842 A * | 9/1999 |
| JP | 2002-270496 | 9/2002 |
| JP | 2003-297716 | 10/2003 |
| JP | 2003-318084 | 11/2003 |
| WO | WO 03/083913 | 10/2003 |

* cited by examiner

*Primary Examiner*—Phuc T Dang
(74) *Attorney, Agent, or Firm*—Sonnenschein Nath & Rosenthal LLP

(57) ABSTRACT

To provide an exposure apparatus and an exposure method able to correct an image-placement error during an exposure which is unable to decrease only by correcting electron beam description data of a mask pattern, and a semiconductor device manufacturing method used the same, wherein an image placement R2 of a mask is measured at an inversion posture against an exposure posture (ST7), the measured image placement R2 is corrected with considering a pattern displacement caused by gravity at the exposure posture and a first correction data Δ1 is prepared based on a difference of the corrected image placement and a designed data (ST10), and an exposure is performed by deflecting charged particle beam to correct a position of a pattern to be exposed to a subject based on the first correction data Δ1 (ST13).

14 Claims, 13 Drawing Sheets

EXPOSURE DEVICE, EXPOSURE METHOD, AND SEMICONDUCTOR DEVICE MANUFACTURING METHOD

TECHNICAL FIELD

The present invention relates to an exposure apparatus and exposure method used to a manufacture of a semiconductor device, a semiconductor device manufacturing method used the same.

BACKGROUND ART

Lithography technique used electron beam, ion beam or other charged particle beam has been developed as next generation lithography. In forming a mask used to the lithography technique, a mask blank (a substrate to be mask) is deeply etched from its reverse surface side to form a thin film region (a membrane) of almost 10 nm to 10 μm thickness and then a pattern to be projected is arranged in the membrane.

Since the mask has a membrane region in lower mechanical rigidity, a method forming a pattern in high placement precision and additionally a method measuring mask strain to correct a placement error by applying with measured data are important.

For example, Electron-beam Projection Lithography (EPL) is used with a stencil mask having a beam structure, and it has been proposed that a mark formed on the beam is measured by a laser interference coordinate measurement apparatus and the measured mask strain is corrected by an electro-optical system.

However, in explanation blow, an influence of the mask deformation caused by gravity is not considered. Further, if an influence of gravity is calculated with respect to the measured mask strain data by a numeric processing, it may not be considered that a difference in the mask shape, a reappearance in a fixing method, or a difference in fixing methods of the mask by the coordinate measurement apparatus and by the exposure apparatus.

On the other hand, in Proximity X-ray Lithography (PXL), a method to correct a mask deformation at the time of an EB description has been proposed (refer to The Japanese Unexamined Patent Publication (Kokai) No. 8-203817).

However the method has to form two masks, so that it is not desirable in terms of production time, handling and cost. Considering yield of a PXL mask, several or more test may have to be performed repeatedly in order to form a single mask. In actual, a production of the PXL mask by this method has not been popularized.

In photolithography, although the mask deformation caused by gravity has been recognized (refer to The Japanese Unexamined Patent Publication (Kokai) No. 6-18220), only improvement of a mask-fixing method or other improvement of hardware has been proposed.

DISCLOSURE OF THE INVENTION

The present invention has as its object to provide an exposure apparatus able to correct an image-placement error which is unable to decrease only by correcting electron beam description data of a mask pattern during exposure, and an exposure method thereof.

The present invention has as its other object to provide a semiconductor device manufacturing method used above exposure method.

To attain the above object, according to the present invention, there is provided an exposure apparatus having a correction data preparation means for correcting an image placement of a mask at an inversion posture against an exposure posture with considering a pattern displacement caused by gravity to prepare a first correction data based on a difference between a corrected image placement and a design data; and a charged particle beam irradiation means for performing an exposure by deflecting charged particle beam based on the first correction data to correct a position of a pattern to be exposed to a subject.

To attain the above object, according to the present invention, there is provided an exposure method having the steps of measuring an image placement of a mask at an inversion posture against an exposure posture; correcting the measured image placement with considering a pattern displacement caused by gravity at the exposure posture to prepare a first correction data based on a difference between a corrected image placement and a design data; and performing an exposure by deflecting charged particle beam based on the first correction data to correct a position of a pattern to be exposed to a subject.

To attain the above object, according to the present invention, there is provided a semiconductor device manufacturing method including an exposure step of irradiating charged particle beam via a mask to project a pattern to a semiconductor device, the exposure step having the steps of measuring an image placement of the mask at an inversion posture against an exposure posture; correcting the measured image placement with considering a pattern displacement caused by gravity at the exposure posture to prepare a first correction data based on a difference between a corrected image placement and a design data; and performing an exposure by deflecting charged particle beam based on the first correction data to correct a position of a pattern to be exposed to a subject.

BRIEF DESCRIPTION OF THE DRAWINGS

FIG. 1A is a cross-sectional view of a stencil mask and FIG. 1B is a cross-sectional view of a scattering membrane mask.

FIG. 2A is a plane view and FIG. 2B is a perspective view.

FIG. 3A is a view of an ideal pattern arrangement, FIG. 3B is a view of a described pattern arrangement in actual and FIG. 3C is a view showing measurement data by a coordinate measurement apparatus.

FIG. 12A is a view of ideal deflection data and FIG. 12B is a view of real deflection data.

BEST MODE FOR CARRYING OUT THE INVENTION

Hereinafter, embodiments according to the present invention will be described with reference to the drawings.

The present embodiment will be described with an example applying the present invention to a lithography which has been developed as next generation lithography and is used electron beam, ion beam or other charged particle.

First, a mask to be applied in the present embodiment will be described.

The above mentioned lithography includes that charged particle beam passed though a mask is reduced and projected by electro- or ion optical system to a wafer (EPL: Electron Projection Lithography and IPL: Ion Projection Lithography etc.) and that a mask pattern is projected to a wafer arranged to be close to and beneath a mask without a focus optical system (PEL: Proximity Electron Lithography).

Figure 1A:
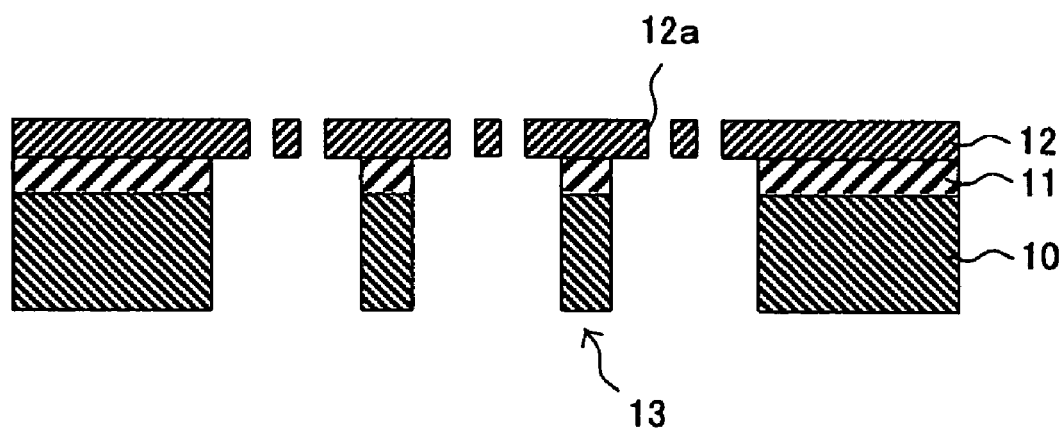
FIGS. 1A and 1B are cross-sectional views of a mask to be applied to an exposure method according to the present embodiment.
Figure 1B:
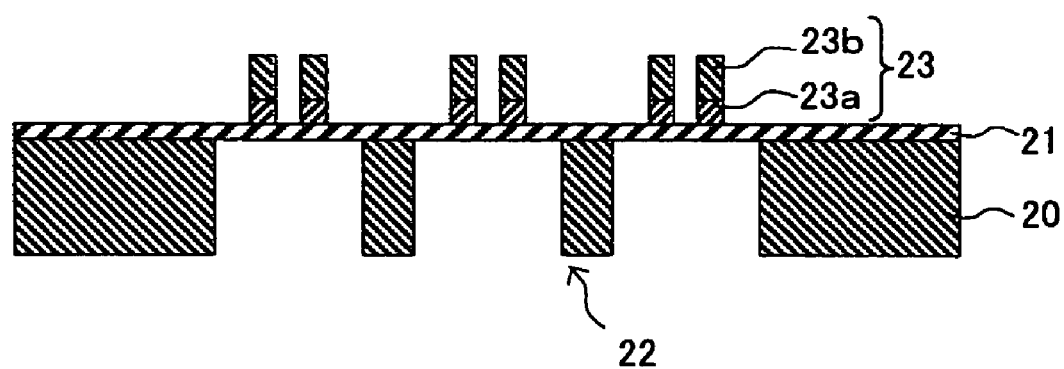

A common point between the above techniques is that a mask blank (a substrate to be a mask) is deeply etched from a reverse side to form a thin film region (a membrane) almost 10 nm to 10 μm thickness and then a pattern to be projected is arranged in the membrane. A mask formed with the projection pattern by apertures of the membrane is called as a "stencil mask" (for example, H. C. Pfeiffer, *Jpn. J. Appl. Phys.* 34, 6658 (1995)). And a mask formed with the projection patterns by a metal thin film or other member for scattering a change particle beam is called as a "scattering membrane mask" (for example, L. R. Harriott, *J. Vac. Sci. Technol. B* 15, 2130 (1997)). FIGS. 1A and 1B are cross-sectional configurations of examples of the stencil mask and the scattering membrane mask.

FIG. 1A is a cross-sectional view of the stencil mask formed by using an SOI substrate. In the stencil mask shown in FIG. 1A, a membrane 12 of an SOI layer is formed on a silicon substrate 10 via an etching stopper layer 11. The silicon substrate 10 and the etching stopper layer 11 are processed to form a beam 13. The membrane 12 sectionalized by the beam 13 is formed with a pattern 12a by apertures. For example, the thickness of the etching stopper layer 11 is 1 μm and the thickness of the membrane 12 is 2 μm.

FIG. 1B is a cross-sectional view of the scattering membrane mask. In the scattering membrane mask, a membrane 21 of, for example, silicon nitride is formed on a silicon substrate 20, and the silicon substrate 20 is processed to form a beam 22. The membrane 21 surrounded by the beam 22 is formed on its surface with a scatter pattern 23 including a chrome layer 23a and a tungsten layer 23b. For example the thickness of the membrane 21 is 150 nm, the thickness of the chrome film 23a is 10 nm and the thickness of the tungsten film 23b is 50 nm.

Figure 2A:
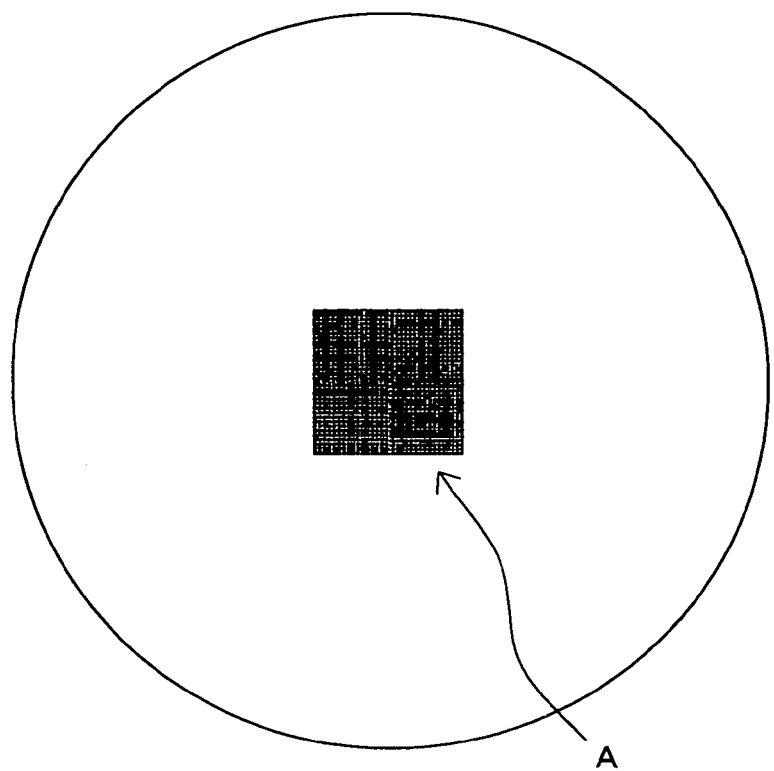
FIGS. 2A and 2B are views of a detail configuration of an example of the mask to be applied to the exposure method according to the present embodiment.

FIG. 2A is a plane view of the mask shown in FIG. 1A or FIG. 1B. As shown in FIG. 2A, an exposure region A is formed with the pattern 12a of the apertures or the scattering pattern 23 in a middle portion of the mask.

Figure 2B:
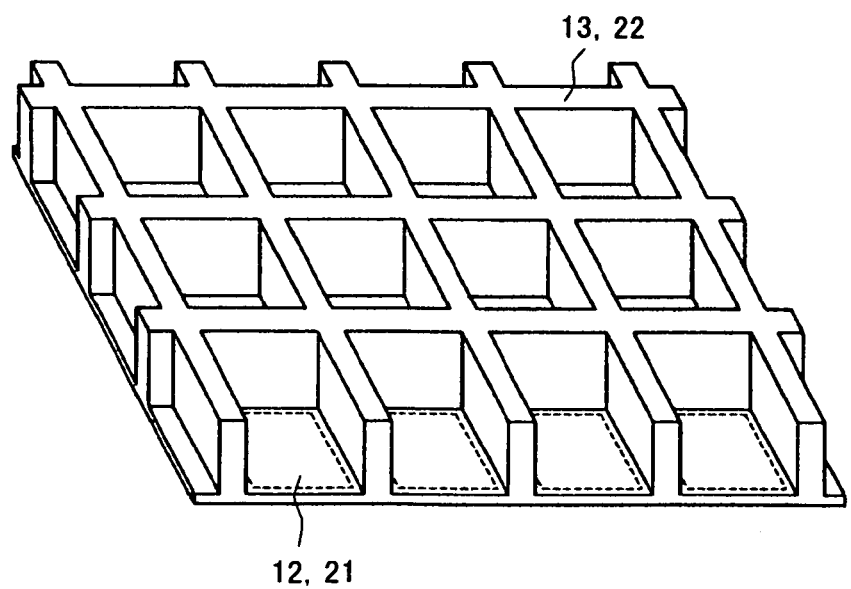

FIG. 2B is a perspective view showing the enlarged exposure region A of FIG. 2A. Since the mask has a membrane in low mechanical rigidity, the entire mask region is formed by a plurality of small-sectioned membranes which is divided by lattice beam, not by a single membrane. As a mask production method having the above beam configuration, there are a method using a wet-etching by KOH or other alkali solutions and a method using a reactive ion etching.

Next, a factor influencing an image-placement error of the mask will be described.

The image-placement (IP) error of the mask can be classified into the followings: (1) an error caused by a mask producing process; (2) an error caused by a deformation of the mask when loading it to an exposure apparatus; (3) an error caused by a density of the mask pattern; and (4) an error caused by mask-heating due to charged particle irradiating or vibration due to shifting the mask during exposure.

Among them, as a correcting method with respect to the error (3), there is a prior application before publication (refer to The Japanese Patent Application (tokugan) No. 2002-119845). The error (4) is considered not to be a disadvantage for PEL which uses low accelerated electron beam of almost several keV and which is not shifted with the mask during exposure. However, it may be possible to be a disadvantage for EPL which uses high accelerated electron beam of 100 keV and which is suffered to the mask with an acceleration of almost 0.2 m/s in maximum during exposure. Therefore, EPL has to be performed with an optimization of a mask-cooling mechanism and a mask stage shift sequence and other techniques for apparatus (for hardware).

Figure 3A:
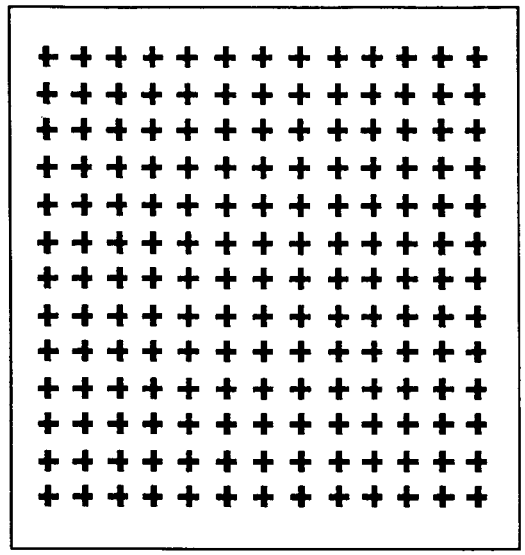
FIGS. 3A to 3C are views of results evaluated a placement precision of a pattern by an EB description apparatus.
Figure 3B:
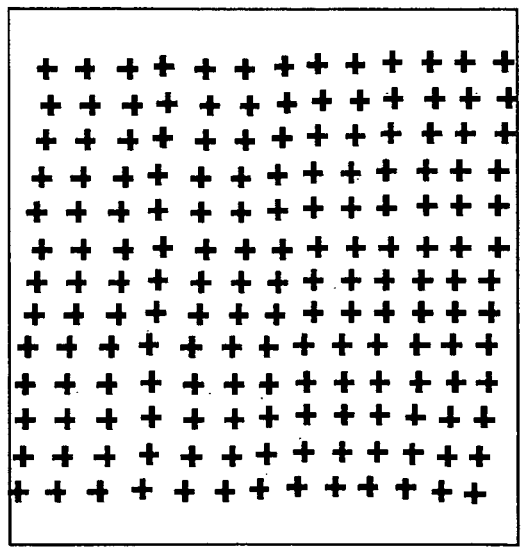
Figure 3C:
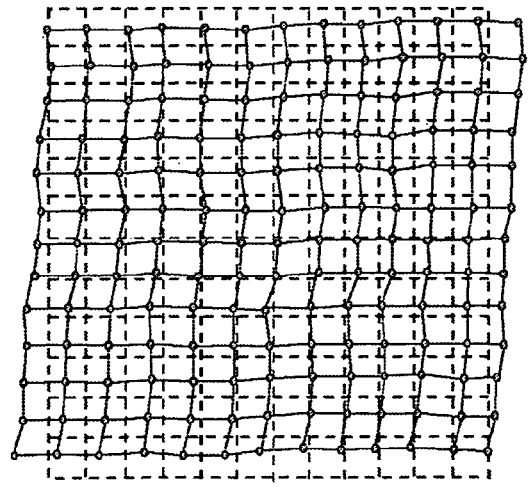

The present embodiment will be described with a method correcting the above errors (1) and (2) by charged-particle optical system of the exposure apparatus. Although the error (1) is classified into more detail factors, a main factor is an error caused by an EB description of a mask pattern. FIGS. 3A to 3C show example data that the placement precision of the pattern described with lattice-shape on a mask which has the configuration shown in FIG. 1A is measured by the laser interference coordinate measurement apparatus.

FIG. 3A shows an ideal pattern arrangement, FIG. 3B shows a described pattern arrangement in actual and FIG. 3C shows a measurement data by the coordinate measurement apparatus. Note that, a displacement of the pattern shown in FIG. 3B is emphasized and illustrated.

As shown in FIGS. 3A to 3C, due to mechanical properties of a wafer stage of the EB description apparatus, the error occurs linearly in the image-positional (IP) precision. The linearly error can be reduced by performing a feedback of data shown in FIG. 3C to the electro-optical system of the EB description apparatus, but it may be difficult to suppress completely the error.

Figure 4A:
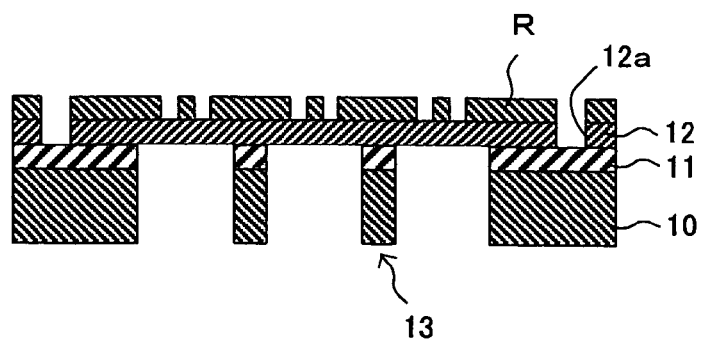
FIG. 4A is a view of a mask posture in a mask production process.
Figure 4B:
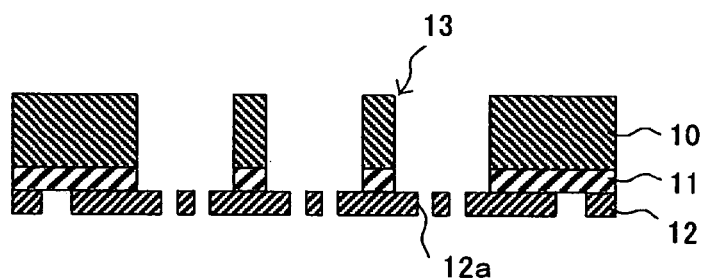
FIG. 4B is a view of a mask posture during exposure and FIG. 4C a view for illustrating a mechanism that a pattern is displaced due to the mask flexure.
Figure 4C:
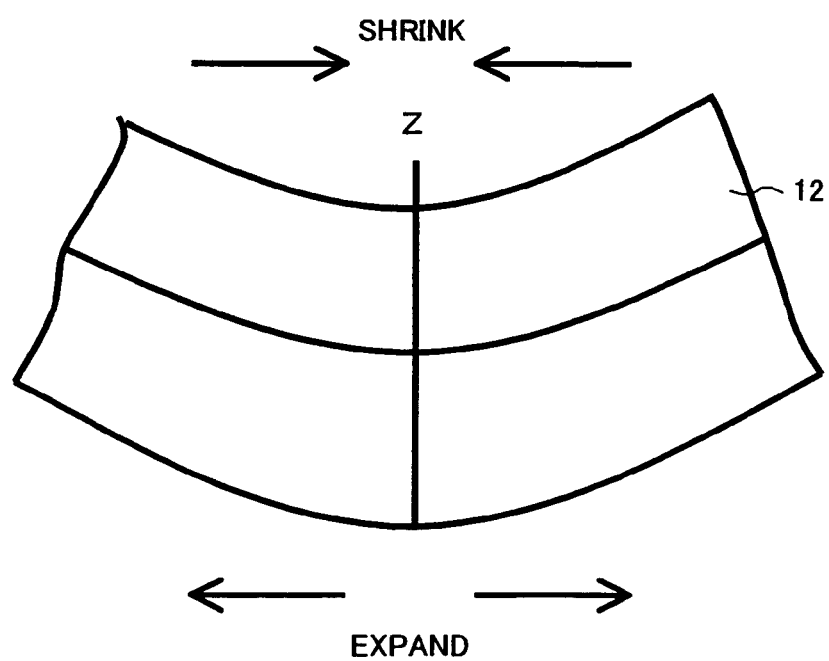

There are two main factors of the error (2). FIGS. 4A to 4C are views for illustrating a first factor. Note that, FIGS. 4A to 4C show a stencil mask as an example.

As shown in FIG. 4A, when producing the stencil mask, the membrane 12 is coated on its surface with a resist R at the upward posture and the resist R is directly described by electron beam to form a pattern. Then, the membrane 12 is etched by using the resist R as a mask to form the pattern 12a of apertures. And an evaluation of the placement precision of the pattern of the produced mask is performed similarly to FIG. 4A with the membrane side made upward.

On the other hand, as shown in FIG. 4B, when exposing the wafer, the mask is load with the membrane 12 made downward, namely with the membrane 12 side close to the wafer, and electron beam is irradiated from the beam 13 formation side.

In this way, the mask posture when exposing (exposure posture) is inversed against the posture when producing and measuring the image placement. Therefore, as shown in FIG. 4C, the membrane 12 is flexed by gravity, so that the upper surface side is shrunk and the lower surface side is expanded. A Z-axis in FIG. 4C shows a perpendicular direction. Since there is the deformation caused by gravity, if the membrane 12 is formed with the pattern in a regular place at an upward posture, the image placement may be shifted when exposing at the inversion posture.

The deformation of the stencil mask caused by gravity has been discussed by using a finite element simulation with quantitative (according to EPL mask, C.-f. Chen et al., *J. Vac. Sci. Thchnol. B* 19, 2646 (2001) and according to PEL mask, S. Omori et al., presented at the forty-sixth International Conference on Electron, Ion, Photon Beam Technology and Nanofabrication, Anaheim Hilton, Anaheim, Calif, 2002).

A second factor is a difference of mask-fixing methods between an EB description apparatus and an exposure apparatus. With a semiconductor or a mask production apparatus, a sample to be proceeded (a wafer or mask blank) is tightly fixed by a vacuum chuck, static chuck or mechanical clamp to the apparatus, but the fixing methods depend on each apparatus. If the mask-fixing methods between the EB description apparatus and the exposure apparatus may be different, since mask flatness at the apparatus are different each other, the pattern displacement may occur by similar mechanism to FIG. 4C.

Next, the flow to exposure according to the present embodiment will be described with reference to FIG. 5. The flow of the present embodiment is classified into a data-processing step, a mask production process and an exposure step.

First, the data-processing step that an original mask design data (an image placement is illustrated by R0) is corrected with considering the pattern deformation caused by gravity to form an EB description data (image placement: R1) will be described. Note that, since the data-processing step is performed with a similar processing to mention in a prior application before publication: The Japanese Patent Application No. 2002-092612, it will be simply described. In the present embodiment, error factors irremovable only by the data-processing step are lowered by the following flow.

A test mask for obtaining EB description correction data is prepared in advance (ST1). The mask does not have to include an actual device pattern, as long as a mask configurations shown in FIGS. 1A and 1B and FIGS. 2A and 2B are same, the mask substantially may be produced one or several for securing reproductively.

Although the test mask includes a pattern for measuring the image-placement (IP) precision by the laser interference coordinate measurement apparatus on the entire mask region as shown in FIG. 3A, the pattern is generally simple shape of several to over 10 μm (square or curb shape), so that a description and processing thereof are exceedingly easy. Namely, the production of the test mask does not prevent from the production of a manufacture mask in terms of amount and technical difficulty.

Figure 6A:
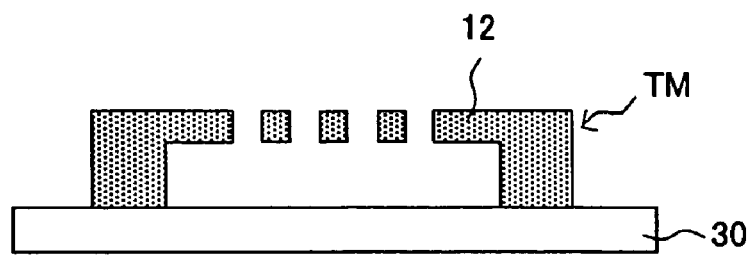
FIGS. 6A to 6C are views for illustrating steps of preparing a pattern transfer function by using a test mask.

Then, as shown in FIG. 6A, the test mask TM is maintained by a maintenance means 30 so that the membrane 12 makes the upward posture, and an image placement RM of the pattern for measuring the image-placement (IP) precision is measured (ST2). If the image placement (IP) can be measured at a similar posture to during exposure, that is the membrane is the downward posture, it may be useful and may not be impossible on principle. However a standard coordinate measurement apparatus able to obtain recently is designed so as to measure a coordinate with a pattern surface side made the upward posture. A remodeling of the apparatus may cause an increasing of cost and prevent from measurements for other order, so that it is not desirable.

Figure 6B:
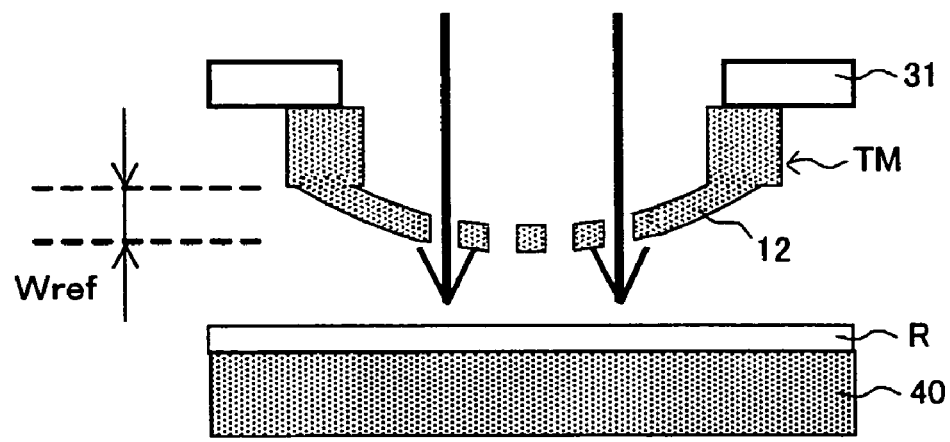
Figure 6C:

Then, as shown in FIG. 6B, the test mask TM is maintained by a mask maintenance means 31 of the exposure apparatus so as to make the membrane 12 the downward posture, and scanned by charged particle beam. Consequently the pattern for measuring the image-placement (IP) precision on the test mask TM is projected to wafer 40 coated with resist R. Further, as shown in FIG. 6C, an etching-processing is performed by using a resist pattern formed after development as a mask, consequently the same pattern is formed on the wafer (ST3). The image placement RW on the wafer is measured by the coordinate measurement apparatus (ST4).

Then, a variation of the image placement deformed by gravity at the postures when describing a mask pattern and exposing thereof is prepared as an image-placement transfer function F'. The image-placement transfer function F' is indicated as a "RF=F'[RM]". Therefore, an image-placement transfer function F of an inverse function of the transfer function F' is used so that the mask pattern is arranged at the exposure posture in a place according to the designed data.

A main cause that the image placement RM of the test mask and the projected image placement RW on the wafer are different is a global deformation of the mask due to gravity as mentioned above, so that the correction by the pattern transfer function F does not depend on each mask patterns. Therefore it is applicable to every manufacture mask universally. By the transfer function F prepared by using the test mask in this way, the original mask design data R0 is converted to the correction mask data R1 (ST5).

Next, a mask production process will be described.

In the mask production process, the mask blank is plotted by the EB description apparatus with a correction mask data R1, formed by the following etching process with a stencil pattern or a scattering pattern as shown in FIG. 1, washed and examined, as a result, the mask is produced (ST6).

The produced mask is measured with the image placement R2 of the mask at similar posture and fixing-method to measurements of the image placement RM of the test mask (ST7). Note that, the manufacture mask is not able to be arranged in the entire mask region with the pattern for measuring the image-placement (IP) precision (hereinafter, simply referred to a "measurement pattern") such as the test mask for preparing the pattern transfer function F.

Although an arrangement example of the measurement pattern in comparison with the manufacture mask will be explained later, the following four methods or combination thereof are possible. In first method, a measurement pattern is formed on the beam to arrange sufficient amount of the measurement patterns in the entire mask region in the case that a mask has a beam structure shown in FIG. 2.

A second method is similar to a longitudinal-dimension precision securance method of a photomask. Namely, the measurement pattern is arranged in surrounding of the device region working in actual so called a "scribe line", where an alignment mark, a production process monitor pattern or a device property measurement pattern is arranged. The method may be impossible to arrange the measurement pattern in the entire mask region. However, the global deformation of the mask is indicated by a function changing a position gently. Therefore, by interpolating the position of the measurement pattern on the scribe line by a lower function, the image-placement (IP) precision of the mask is obtained without lowering precision.

In a third method, the measurement pattern at the position is arranged in the device region free from obstacles. In other words, if the multilayer configuration of the device has a region that the layers contacting to a mask layer have no pattern, the measurement pattern can be arranged on principle. The regions can be obtained by performing an OR operation to three mask data corresponding to the mask layer and layers contacting to the mask layer.

In a fourth method, marks are arranged in surrounding the mask region. As shown in FIG. 2A, since a circumference of the exposure region A exposed by charged particle beam is a substrate region supporting the membrane, the measurement pattern can be arranged free from restriction.

An error δR of the image placement (IP) of the mask is prepared by a difference between a measured value R2 and the correction mask data R1 and evaluated (ST8 and ST9). The error δR is set to an error caused by the mask production process, and if it is over the permissive value, the mask may have to be reproduced.

However, it is considered that the next generation semiconductor device applied with lithography using charged particle beam (EPL, IPL and PEL) will become ultra-fine with a circuit minimum line width of less than 90 nm. Therefore, the image-placement (IP) precision required to the mask becomes extremely strict.

Particularly, PEL has to be formed on the mask with a pattern which is similar size to an actual device. Considering an operation of the present EB description apparatus, if the permissive value of "δR" indicated to an ITRS road map is applied, there is a possibility that yield of the mask becomes extremely lower.

In the present embodiment, it is paid attention to a superior characteristic that charged particle beam is deflectable extremely in high precision by electron field lens and that photolithography using photon does not have this, a part of the mask strain (the image-placement error δR) is corrected by a sub-deflection operation of the exposure apparatus during exposure. Therefore, the permissive value of the IP error δR in the mask production is eased and yield of the mask production can be improved substantially. Due to this, cost for producing the mask becomes lower and it leads to the decrease of the entire cost for the semiconductor device production.

At the step ST9, the correction data Δ1 during exposure is prepared to the mask satisfied some eased-permissive value. The pattern in the placement R2 with the membrane made the upward posture is considered to displace to the position F[R2] at the exposure posture, so that "Δ1=F[R2]−R0" indicates a first correction data (ST10).

The first correction data is prepared by the correction data preparation means in the present invention. The correction data preparation means is realized by reading the program for the above operation processing to a data processing apparatus.

A method that the mask strain is corrected and exposed by measuring a placement precision of the pattern of the produced mask and performing a feedback of the measured data to the electro-optical system has been proposed with restricting EPL for example (L. E. Ocola et al., *J. Vac. Sci. Technole. B* 19, 2659 (2001)). However, in the related art, that an inversion of the mask posture during a measurement of the image placement (IP) or exposure affects the image placement (IP) (referring to FIG. 4C) is not considered. Furthermore, the "R2-R0" is used as the correction data.

Since it is indicated that the inversion of the posture causes the pattern displacement no less than several 10 nm (aforementioned; C.-f. Chen et al., *J. Vac. Sci. Technol. B* 19, 2646 (2001)), it is evident that the method in the related art is not operated correctly. The present embodiment has a characteristic that the image-placement transfer function is calculated in advance and applied to the EB description correction (R0 to R1 in FIG. 5) and additionally applied to a correction of an error caused by the mask production process. Further, in explanations blow, the error of the image-placement transfer function caused by a difference of the mask shapes can be corrected. This is not paid for attention in the past.

The mask measured the image-placement (IP) precision is loaded to the exposure apparatus. Before an exposure, the height of the mask W(x,y) is measured as a function of the placement (ST11). Here, the "(x,y)" is indicated as a coordinate of the mask plane. The heighten measurement is performed by a laser interference meter (A. Ehrmann et al., SPIE 3997, 385 (2000)), an electrostatic capacity sensor (M. Oda et al., *Jpn. J. Appl. Phys.* 34, 6729 (1995)) or other mask shape measurement means. Since a mask stage of the exposure apparatus in explanations blow is ultra high precision, for example, while the mask stage is shift and a distance between the sensor and the mask is measured by the electrostatic capacity sensor which is close to the mask, consequently the "W(x,y)" could be obtained accurately.

Note that, the above measurement does not have to be performed in the exposure apparatus and it may possible that an independent apparatus having the measurment means is produced and used. However, as mentioned above, the same mask-fixing method as possible as the exposure apparatus or a method securing flatness at least same level has to be employed.

If the shape (W) of the mask surface is similar to a shape $W_{ref}$ of the test mask (measured in advance) utilized for preparing the transfer function F, only the first correction data Δ1 may be necessary. However, the mask shape has actually an individual difference. For example, the stencil mask in FIG. 1A is formed by the SOI wafer. The SOI wafer may curve several 10 μm by the compressive stress of several 100 MPa of the etching stopper film of a buried oxidation film, and the amount of curve is differ to the respective SOI wafers.

Figure 5:
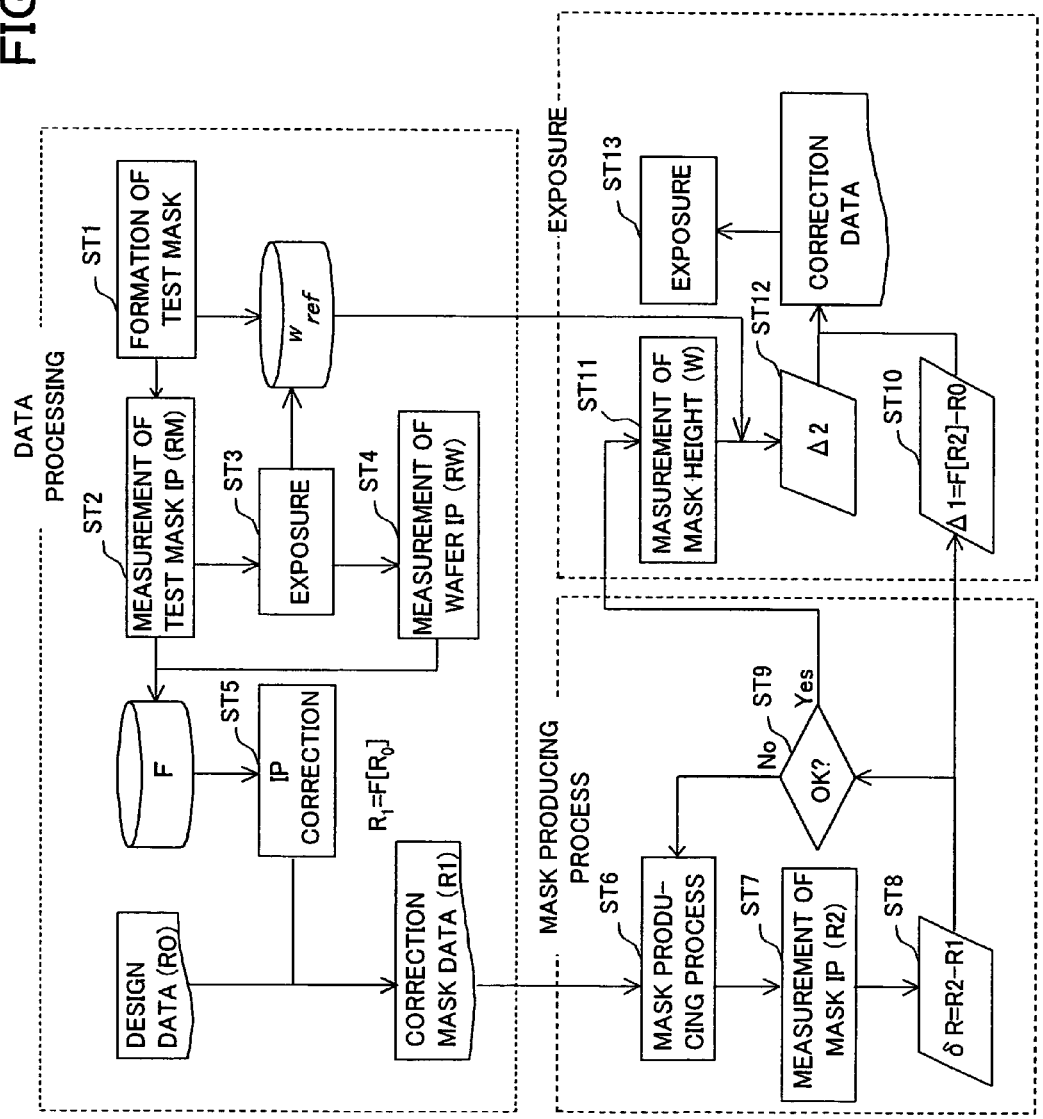
FIG. 5 is a view for illustrating an exposure apparatus and the exposure method according to the present embodiment.

Therefore, as shown in FIG. 5, the image-placement (IP) error caused by the individual difference of the mask shape is calculated as a second correction data Δ2 (ST12). The second correction data is prepared by the correction data preparation means of the present invention. The correction data preparation means is realized by reading a program performing a processing in explanations blow to a data-processing apparatus. There are two methods preparing the second correction data Δ2 based on a variation of height. Hereinafter, the method preparing the second correction data Δ2 by the correction data preparation means will be described.

A first method is suggested in FIG. 4C, and the displacement of the pattern is related to a local tilt of the mask surface. According to a document of material dynamics (for example, S. P. Timoshenko and S. Woinowsky-Krieger, "*Theory of Plates and Shells.*"), a fine flexure of a flat plate is indicated by the following formula (1).

$$u = -\frac{h}{2}\left(\frac{\partial w}{\partial x}\right) \quad (1)$$
$$v = -\frac{h}{2}\left(\frac{\partial w}{\partial y}\right)$$

With the formula (1), the "u" and "v" are indicated as displacements of x-direction and y-direction each other, and the "h" is indicated as a thickness of the flat plate. The mask having the beam structure such as FIGS. 2A and 2B may not be flat plate strictly, it is considered that the formula is realized approximately. Therefore, since the "W" of the formula (1) is replaced to "(W−W$_{ref}$)", the second correction data Δ2 of the image-placement (IP) error caused by a curved shape of the respective masks during exposure is obtained. The operation in this way is performed by the correction data preparation means to prepare the second correction data.

A second method for preparing the second correction data Δ2 will be described.

Namely, the steps shown in FIGS. 6A to 6C are performed to a plurality of the test masks, so the relation between a displacement of the pattern RW projected to the wafer in comparison with design data of the test mask (corresponding to the second correction data Δ2) and the curved shape W$_{ref}$ of the test mask measured in the step shown in FIG. 6B is prepared.

Then, a plurality of second correction data of the curved shapes W$_{ref}$ is prepared respectively and made database. The database is corresponding to the memory means of the present invention.

Due to this, after measuring the curved shape W of the manufacture mask, the second correction data Δ2 prepared for the test mask having a most similar curved shape of the shape W is read from the formed database and utilized.

As mentioned above, a deflection correction data can be prepared.

Note that, the deflection correction data can be known indirectly by, such as so called a "exposure for obtaining conditions" in photolithography, performing a test exposure to a wafer arranged a superposition-precision measurement sub-mark and measuring a related placement (superposition-precision measurement) between a superposition-precision measurement main-mark projected from the mask to the wafer and the sub-mark on the wafer (it can be known only relatively a mask strain making the sub-mark on the wafer as a reference). However, the procedure for obtaining a condition makes a throughput of the exposing step lower and cost for the entire process of the device production increase, so that it is not desirable.

In the present embodiment, the correction data can be rapidly prepared without the test exposure by using the measured data for the image-placement (IP) precision which is performed usually for securing a longitudinal dimension precision in the mask production process and a mask height measurement data performed in the exposure apparatus.

The first and second correction data Δ1 and Δ2 prepared as mentioned above (deflection correction data) are stored to a memory unit of the charged particle exposure apparatus.

Figure 7:
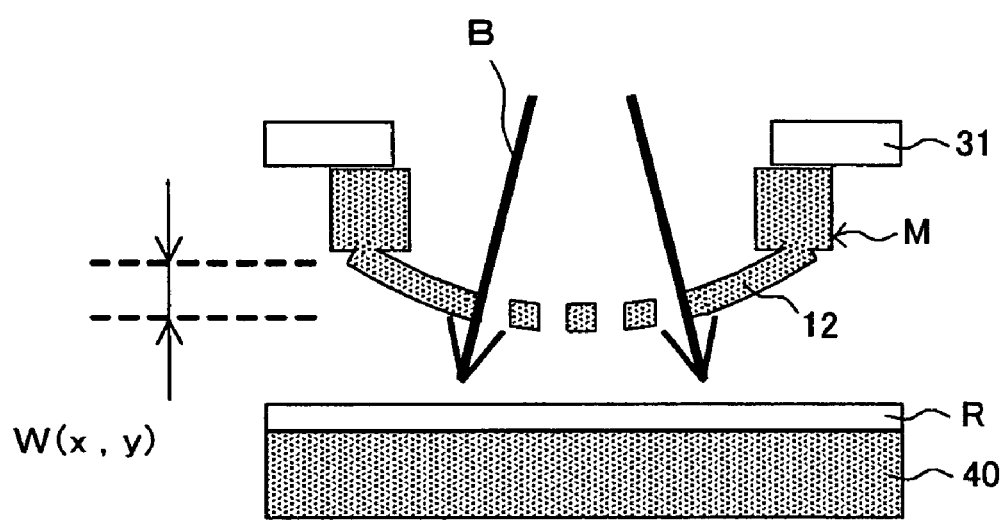
FIG. 7 is a view of an appearance that charged electron beam is deflected by the exposure apparatus.

Then, as shown in FIG. 7, when charged particle beam B scans the mask M by a main deflector lens of the charged particle optical system (charged particle beam irradiation means), since a sub deflector lens deflects slightly a progress direction of charged particle beam B in accordance with the deflection correction data, the pattern deformed from an original position caused by the mask strain is projected to a correct position on the wafer 40 (ST13). Note that the deflection correction data may be stored to another memory unit and downloaded from the memory unit when exposing by online and used.

Due to this, the image-placement (IP) precision required to the mask can be eased somewhat and it is realized to reduce of the cost for producing the mask and producing time for them.

Next, based on the deflection correction data, an example of a configuration of the exposure apparatus for exposing a wafer will be described. In terms of using an equal scale stencil mask, the image-placement (IP) precision required to the PEL mask may be stricter than the EPL mask and IPL mask. Then, an example applying the present invention to PEL will be described.

Figure 8:
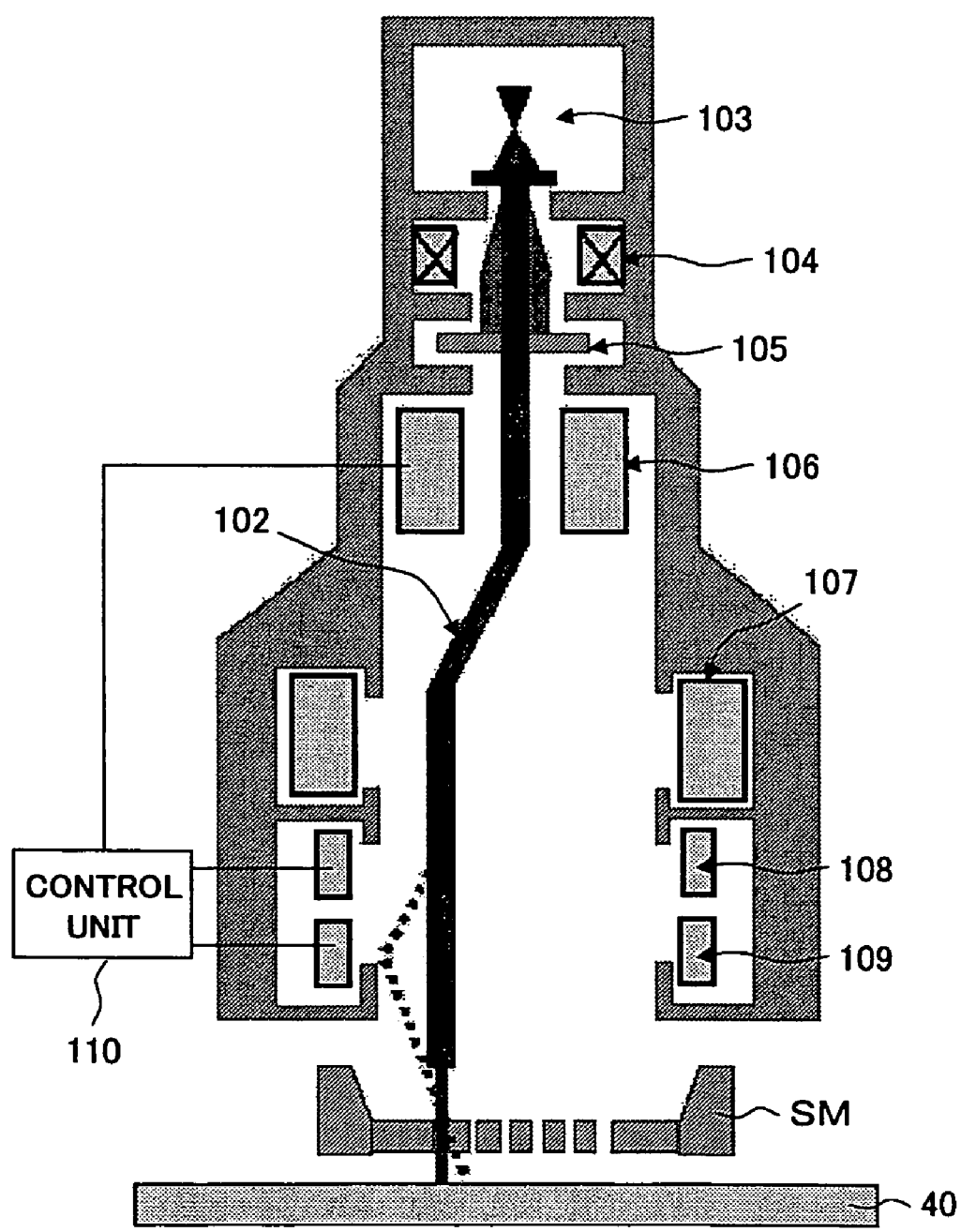
FIG. 8 is a view of an example of a configuration of the exposure apparatus performing the exposure method according to the present embodiment.

FIG. 8 is a general view of the electro-optical system of a low accelerated voltage electron beam proximity exposure apparent of equal scale. The exposure apparatus mentioned above is mentioned in the document (T. Utsumi, U.S. Pat. No. 5,831,272 (3 Nov. 1998)).

An exposure apparatus 100 shown in FIG. 8 has, as an electro-optical system, an electron gun 103 emitting electron beam 102, a condenser lens 104 making the electron beam 102 parallel, an aperture 105 restricting the electron beam 102, a pair of main deflectors 106 and 107 deflecting the electron beam 102 so as to make it parallel in laster or vector scan mode and make it be incident to the stencil mask SM perpendicularly, a pair of fine adjustment deflectors 108 and 109 performing an adjustment, and a control unit 110 controlling an operation of the entire apparatus. The electro-optical system 103 to 110 including the control unit corresponds to a charged-particle beam irradiation means which deflects electron beam (charged particle beam) based on the correction data prepared by the correction data preparation means, and irradiates the beam.

In the exposure apparatus shown in FIG. 8, since low accelerated electron is used, the stencil mask SM shown in FIG. 1A is used. In FIG. 8, the resist on the wafer 40 is exposed by the electron beam 102 passed though the apertures of the stencil mask ST. The exposure apparatus shown in FIG. 8 employs an equal scale exposure, and the stencil mask SSM and the wafer 40 are arranged proximity. Since there is not a reduction production optical system between the stencil mask SM and the wafer 40, the exposure apparatus has relativity simple configuration.

The control unit 110 controls the main deflectors 106 and 107 and makes the electron beam 102 scan on the stencil mask SM to project the mask pattern to the wafer 40. During exposure, by reading the deflection correction data and controlling the fine adjustment deflectors 108 and 109 to change slightly a direction of the electron beam 102, the pattern displaced from an original position caused by the mask strain is projected to the correct position on the wafer 40. In the above control, it may be needed to prepare beforehand a correlation between a various deflection correction data indicating an error of the image placement and a condition of applied voltage to the fine adjustment deflectors 108 and 109 for projecting pattern to the correct position on the wafer 40.

Note that, it is omitted in the drawing, since the wafer stage and the mask stage are proximity, the mask shape can be measured by applying the operation system of the mask stage to scan the mask on the static capacity sensor provided on the wafer stage.

Figure 9A:
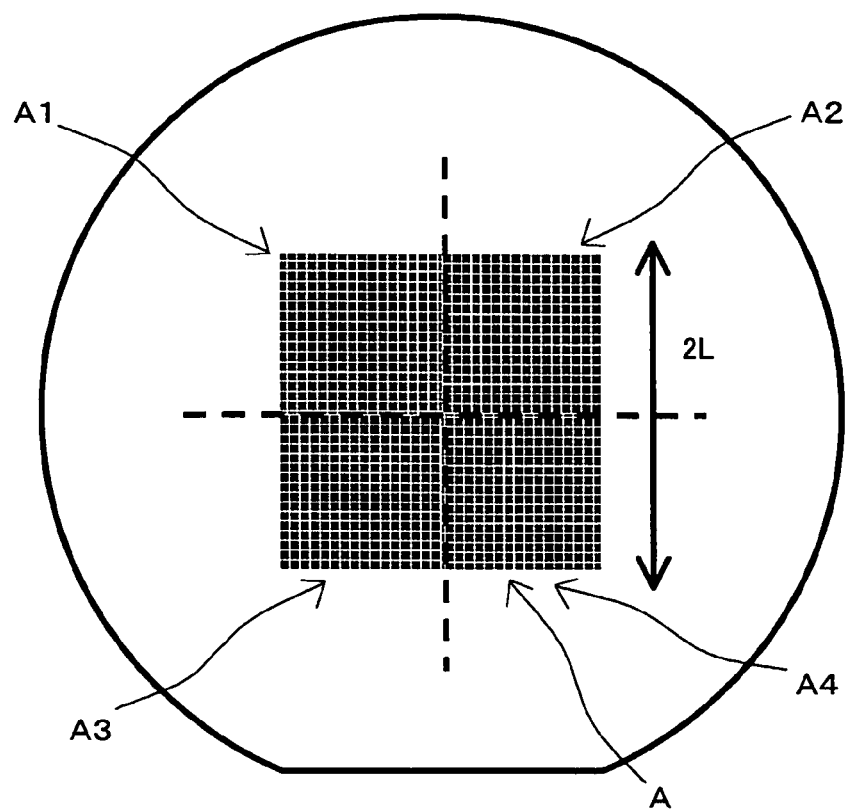
FIG. 9A is a plane view of a detailed example of the mask used to the exposure apparatus of FIG. 8

FIG. 9A is a plane view of a stencil mask used the exposure apparatus shown in FIG. 8.

The stencil mask shown in FIG. 9A is formed by an SOI wafer in four-inch diameter, and formed with an exposure region A (L=20 mm) of 40 mm square in its middle portion. The membrane thickness utilized the SOI layer is 600 nm and the thickness of the etching stopper layer of a prevention layer for etching the reverse surface is 400 nm.

Figure 9B:
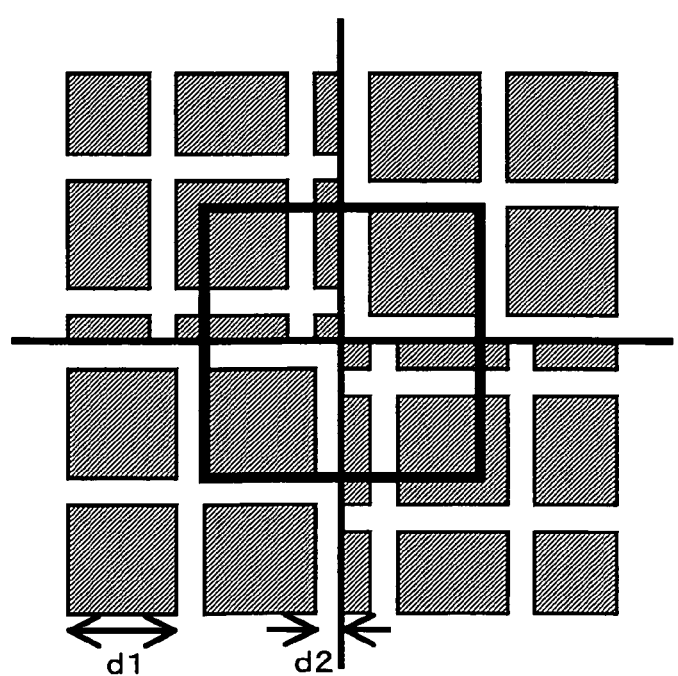
FIG. 9B is an enlarged view of an exposure region.

FIG. 9B shows an enlarged view of an example of the exposure region A of FIG. 9A.

In FIG. 9B, the membrane size d1 is 1050 μm and the beam width d2 is 200 μm. As shown in FIGS. 9A and 9B, the exposure region A is divided into four regions A1 to A4 and the mask patterns divided complementary are suitably distributed and arranged to the four regions (I. Ashida, S. Omori and H. Ohnuma, Proc. SPIE 4754, 847 (2001)).

Figure 10A:
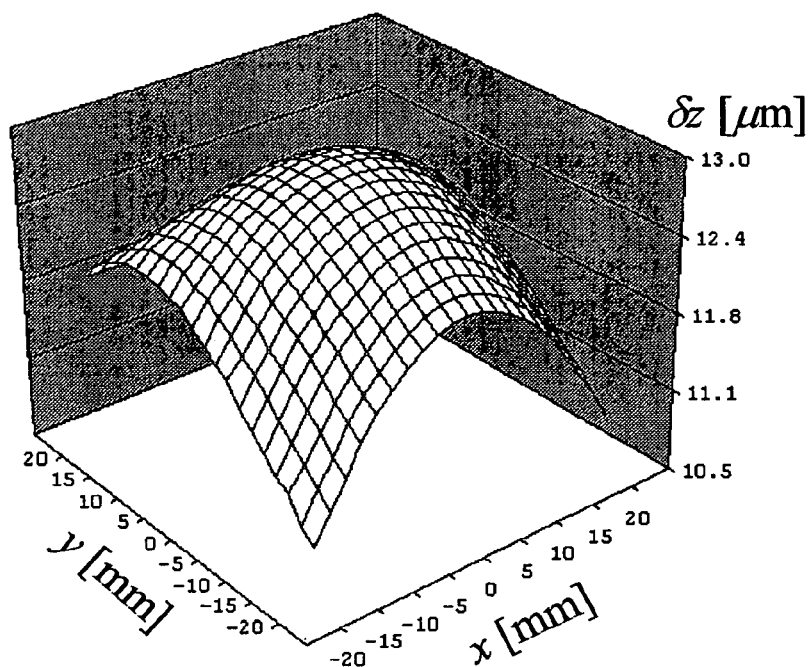
FIG. 10A is a view of a deformation of a stencil mask caused by gravity and FIG. 10B is a view of amount of a pattern displacement due to the deformation.
Figure 10B:
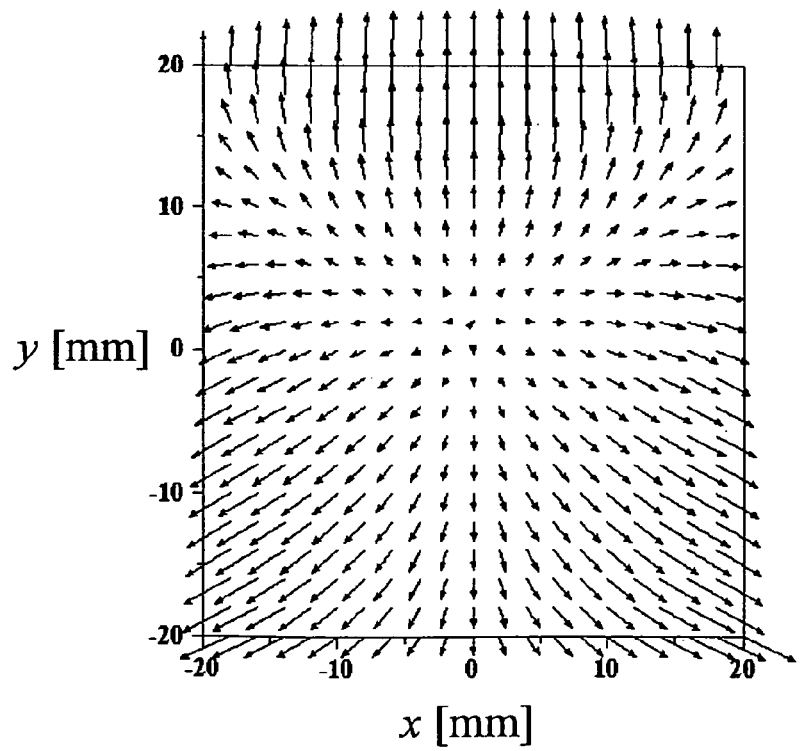

FIG. 10A shows a deformation of the stencil mask in middle portion 40 mm square that the deformation is caused by gravity. As shown in FIG. 10A, the stencil mask has almost 1.5 μm height difference in it and the pattern displacement caused by the height difference is 44 nm in maximum. Note that, as shown in FIG. 10B, the displacement caused by the global deformation of the mask is indicated by a function of gently changing a placement and can be corrected by the transfer function F as above mentioned.

Figure 11A:
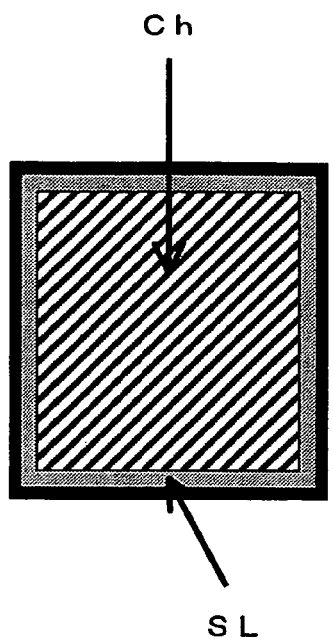
FIGS. 11A and 11B are views for illustrating arrengable regions for a measurement pattern of the stencil mask.
Figure 11B:
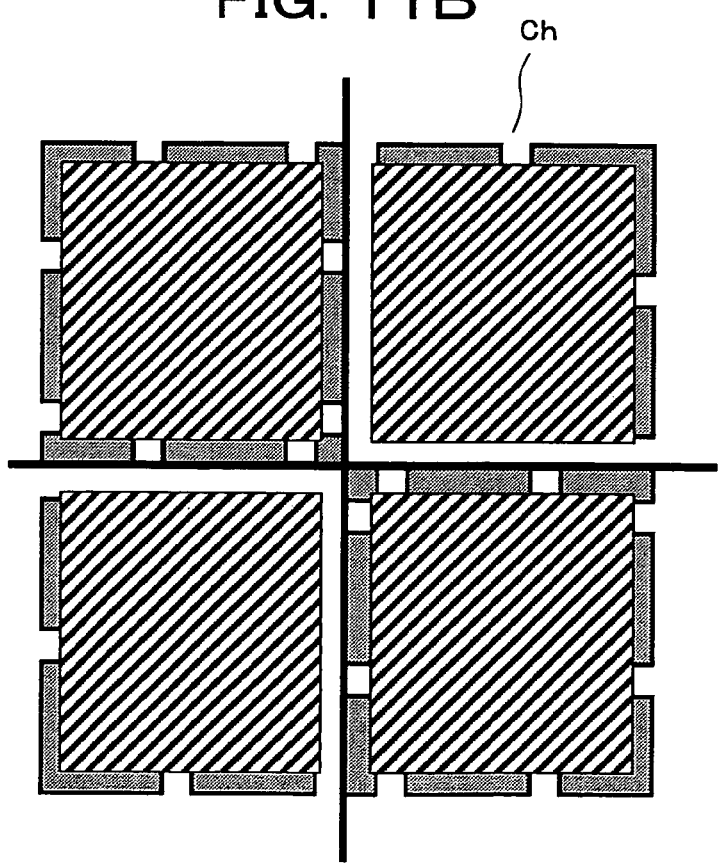

The scribe line SL is arranged around the chip Ch as shown in FIG. 11A and the chips Ch is arranged in the mask as shown in FIG. 11B.

In this case, since the region that the beam is formed in the respective regions A1 to A4 of the mask shown in FIGS. 9A and 9B are arranged with the pattern formation region of other regions A1 to A4, the scribe line SL provided surrounding chip can be formed with the pattern for measuring the image-placement (IP) precision. It contributes to improve a correction precision. Note that, the pattern formation region is defined as a region free from forming the beam in the membrane region.

The mask produced by the correction mask data R1 is measured with the image-placement (IP) precision as shown in FIG. 5 (ST7) and the placement precision thereof is checked (ST8 and ST9). The satisfied mask is calculated with the first correction data Δ1 (ST 10). Then, the mask is loaded to the exposure apparatus shown in FIG. 8 and measured with its height by the electrostatic capacity sensor similar to the test mask. As mentioned above, the shape difference between the test mask and the mask may be converted to the second correction data Δ2, or may be used the database recorded the relation of the image-placement (IP) error and the mask shape. Finally, the exposure apparatus shown in FIG. 8 exposes by using the sum of two correction data (ST13).

The effect of the present embodiment will described with referring to FIGS. 12A and 12B and FIGS. 13A and 13B.

Figure 12A:
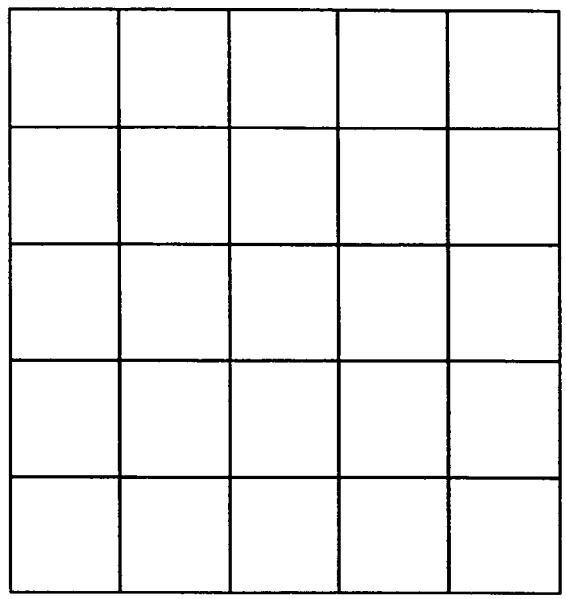
FIGS. 12A and 12B are views of a deflection correction data.
Figure 12B:
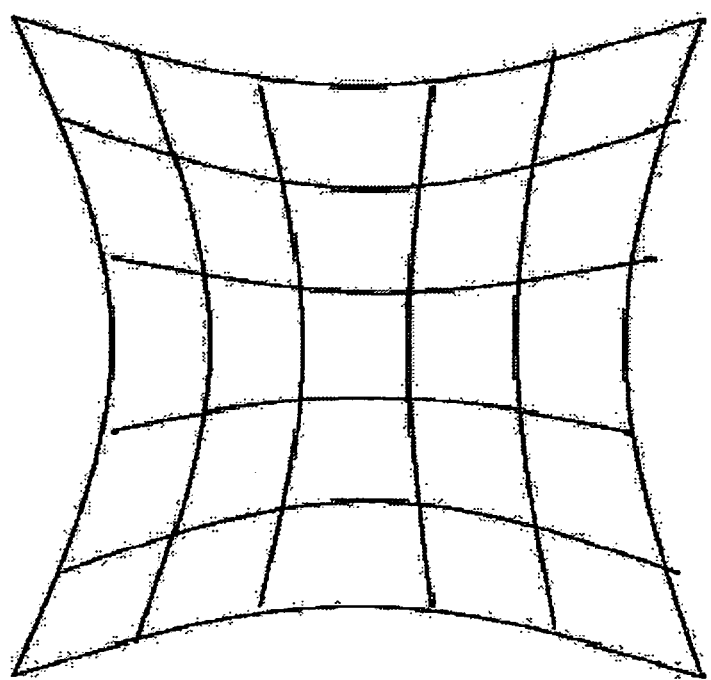

In the case of ideal data unnecessary to correct as shown in FIG. 12A, the electron beam 102 scans the wafer perpendicularly by the main deflectors 106 and 107. On the other hand, in the case that the deflection correction data prepared in the flow of FIG. 5 is set to data such as shown in FIG. 12B, the electron beam 102 is deflected by the fine adjustment deflectors 108 and 109 to, the wafer based on the correction data, and irradiated to the wafer in the present embodiment.

Figure 13A:
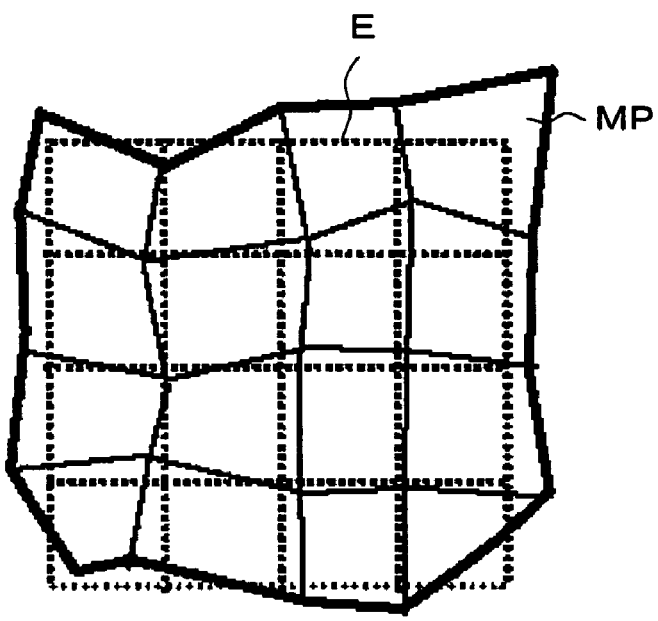
FIGS. 13A and 13B are views for illustrating effects of the exposure method according to the present embodiment.
Figure 13B:
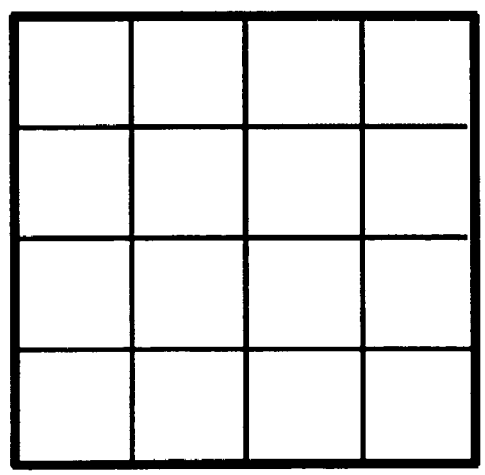

The effect of the exposure using the deflection correction data will be shown in FIGS. 13A and 13B.

As shown in FIG. 13A, even if the mask pattern MP is warped from ideal lattice E, it is corrected by the deflection during exposure shown in FIG. 13B to make lattice high precision on the wafer and projected.

Effects of the exposure apparatus, the exposure method and the semiconductor device manufacturing method according to the present embodiment as mentioned above will is summarized as the following.

First, by the correction of the image placement by the transfer function, the image-placement precision of the mask will improve and yield of the device will increase.

Then, the image-placement precision required to the mask can be eased and yield of the mask will improve. Due to this, the mask cost can be lowered.

By measurement of a height of the mask at the exposure apparatus, the error caused by a difference of the mask substrate can be corrected, so that a specification of the flatness of the substrate can be eased and the mask price can be lowered.

By changing of an irradiate angle of the charged particle beam based on the deflection correction data and irradiating the beam to the wafer, the placement precision of the pattern projected on the wafer improves and yield of the device increases.

The present invention is not limited to the above embodiments.

For example, the flow of FIG. 5 can be applied to the EPL and IPL mask. In EPL and IPL, a mask and a wafer are not proximity, so that the height measurement of the mask is needed to perform different mechanisms from the exposure apparatus shown in FIG. 8. If the correction data of the image-placement (IP) error is same, since the electro- or ion optical system is different, the apparatus control method for the deflection correction is different.

Other than the above, a variety of modification may be made within the scope of the present invention.

INDUSTRIAL APPLICABILITY

The exposure apparatus and the exposure method in the present invention can be applied to an exposure step used charged particle beam for manufacturing a semiconductor device for example. And the semiconductor device manufacturing method in the present invention can be applied to a manufacture of a semiconductor device employing an exposure step using charged particle beam.

The invention claimed is:

1. An exposure method comprising the steps of:
determining a measured image placement by scanning a mask disposed at a posture with respect to gravity, said posture being inverted relative to an exposure posture, and measuring a resulting image placement;
preparing first correction data, said first correction data being based on a difference between the measured image placement and design data and consideration of a pattern displacement caused by gravity at the exposure posture; and
performing an exposure by deflecting, using said first correction data, a charged particle beam to correct a position of a resulting exposure pattern.

2. An exposure method as set forth in claim 1, wherein a transfer function indicating an interrelation of the pattern displacement caused by gravity at the exposure posture and the measured image placement is prepared by using a test mask in advance, and the position of the resulting exposure pattern is corrected by using said transfer function.

3. An exposure method as set forth in claim 1, wherein said mask is provided with a pattern for measuring a placement precision, said pattern differing from the resulting exposure pattern, and the step of determining a measured image placement comprises measuring the resulting image placement to determine the placement precision of said mask.

4. An exposure method comprising the steps of:
determining a measured image placement by scanning a mask disposed at a posture with respect to gravity, said posture being inverted relative to an exposure posture, and measuring a resulting image placement;
preparing first correction data, said first correction data being based on a difference between the measured image placement and design data and consideration of a pattern displacement caused by gravity at the exposure posture;
measuring a curved shape of said mask at the exposure posture;
preparing second correction data indicating a displacement of the image placement caused said measured curved shape; and
performing an exposure by deflecting, based on said first correction data and said second correction data, a charged particle beam to correct a position of a resulting exposure pattern.

5. An exposure method as set forth in claim 4, wherein the step of preparing said second correction data comprises indicating a displacement of the resulting image placement based on a difference of the measured curved shape of a test mask at the exposure posture measured in advance and a curved shape of a production mask.

6. An exposure method as set forth in claim 4, wherein the step of preparing said second correction data comprises:
preparing a plurality of second correction data, wherein each of said plurality of second correction data indicates a displacement of a resulting image placement based on a difference of a measured curve shape of each of a plurality of test masks at the exposure posture each of said plurality of test masks having a different curved shape;
storing said plurality of second correction data in a database, and
reading out said plurality of second correction data from said database and utilizing a selected second correction data corresponding to a test mask having closest curved shape in comparison with said curved shape of a production mask.

7. An exposure method as set forth in claim 1, wherein a stencil mask is used as said mask.

8. An exposure method as set forth in claim 1, wherein electron beam is used as said charged particle beam.

9. A semiconductor device manufacturing method having an exposure step of projecting a pattern to a semiconductor device by irradiating charged particle beam via a mask, said exposure step comprising the steps of:
determining a measured image placement by scanning said mask disposed at a posture with respect to gravity, said posture being inverted relative to an exposure posture, and measuring a resulting image placement;
preparing first correction data, said first correction data being based on a difference between the measured image placement and design data and consideration of a pattern displacement caused by gravity at the exposure posture; and
performing an exposure by deflecting, using said first correction data, a charged particle beam to correct a position of a resulting exposure pattern.

10. A semiconductor device manufacturing method as set forth in claim 9, wherein a transfer function indicating an interrelation of the pattern displacement caused by gravity at the exposure posture and the measured image placement is prepared by using a test mask in advance, and the position of the resulting exposure pattern is corrected by using said transfer function.

11. A semiconductor device manufacturing method as set forth in claim 9, wherein said mask is provided with a pattern for measuring a placement precision, said pattern differing from the resulting exposure pattern, and the step of determining a measured image placement comprises measuring the resulting image placement to determine the placement precision of said mask.

12. A semiconductor device manufacturing method as set forth in claim 9, comprising the steps of:
determining a measured image placement by scanning a mask disposed at a posture with respect to gravity, said posture being inverted relative to an exposure posture, and measuring a resulting image placement;
preparing first correction data, said first correction data being based on a difference between the measured image placement and design data and consideration of a pattern displacement caused by gravity at the exposure posture;
measuring a curved shape of said mask at the exposure posture;
preparing second correction data indicating a displacement of the image placement caused said measured curved shape; and
performing an exposure by deflecting, based on said first correction data and said second correction data, a charged particle beam to correct a position of a resulting exposure pattern.

13. A semiconductor device manufacturing method as set forth in claim 12, wherein the step of preparing said second correction data comprises indicating a displacement of the resulting image placement based on a difference of the measured curved shape of a test mask at the exposure posture measured in advance and a curved shape of a production mask.

14. A semiconductor device manufacturing method as set forth in claim 12, wherein the step of preparing said second correction data comprises:
preparing a plurality of second correction data, wherein each of said plurality of second correction data indicates a displacement of a resulting image placement based on a difference of a measured curve shape of each of a plurality of test masks at the exposure posture each of said plurality of test masks having a different curved shape;
storing said plurality of second correction data in a database, and
reading out said plurality of second correction data from said database and utilizing a selected second correction data corresponding to a test mask having closest curved shape in comparison with said curved shape of a production mask.

* * * * *